(12) United States Patent
Wang et al.

(10) Patent No.: US 8,748,248 B2
(45) Date of Patent: Jun. 10, 2014

(54) SEMICONDUCTOR DEVICE INCLUDING CONTACT HOLES AND METHOD FOR FORMING THE SAME

(71) Applicant: Semiconductor Manufacturing International Corp., Shanghai (CN)

(72) Inventors: Xinpeng Wang, Shanghai (CN); Yi Huang, Shanghai (CN)

(73) Assignee: Semiconductor Manufacturing Internatonal Corp., Shanghai (CN)

( * ) Notice: Subject to any disclaimer, the term of this patent is extended or adjusted under 35 U.S.C. 154(b) by 0 days.

(21) Appl. No.: 13/833,972

(22) Filed: Mar. 15, 2013

(65) Prior Publication Data

US 2013/0256806 A1    Oct. 3, 2013

(30) Foreign Application Priority Data

Mar. 29, 2012  (CN) .......................... 2012 1 0088632

(51) Int. Cl.
  *H01L 21/8238*   (2006.01)
(52) U.S. Cl.
  USPC ............ 438/199; 438/216; 438/622; 438/633

(58) Field of Classification Search
  USPC .................. 438/199, 216, 622, 631, 633, 634
  See application file for complete search history.

(56) References Cited

U.S. PATENT DOCUMENTS

| | | | | |
|---|---|---|---|---|
| 8,004,035 | B2 * | 8/2011 | Sudo | 257/327 |
| 2009/0014807 | A1 * | 1/2009 | Tang et al. | 257/369 |
| 2009/0017630 | A1 * | 1/2009 | Lee et al. | 438/702 |
| 2009/0206414 | A1 | 8/2009 | Sudo | |

* cited by examiner

*Primary Examiner* — Kevin M Picardat
(74) *Attorney, Agent, or Firm* — Anova Law Group, PLLC

(57) ABSTRACT

A semiconductor device including contact holes and method for forming the same are provided. A dual-stress liner is formed on a substrate. A first, second and third dielectric layers are then formed over the dual-stress liner. The second dielectric layer has a top surface leveling with that of an overlapping portion of the dual-stress liner. The third dielectric layer is etched to form first openings to have the etching stop at the second dielectric layer and at the upper stress liner of the overlapping portion. The second dielectric layer, the first dielectric layer and the upper stress liner are etched along the first openings to form second openings having the etching stop at the lower stress liner of the overlapping portion and the dual-stress liner in other regions. The stress liners are etched to form contact holes.

15 Claims, 7 Drawing Sheets

SEMICONDUCTOR DEVICE INCLUDING CONTACT HOLES AND METHOD FOR FORMING THE SAME

CROSS REFERENCE TO RELATED APPLICATIONS

The present application claims priority to Chinese patent application No. CN201210088632.9, filed on Mar. 29, 2012 and entitled "METHOD FOR FORMING CONTACT HOLE", the entire disclosure of which is incorporated herein by reference.

FIELD OF THE DISCLOSURE

The present disclosure generally relates to the field of semiconductor manufacturing and, more particularly, to a semiconductor device including contact holes and method for forming the same.

BACKGROUND OF THE INVENTION

It is a known fact that stress can vary the band gap and carrier mobility in silicon. Recently, stress has become one of the most important factors affecting a MOS transistor's performance. If the stress could be appropriately controlled, carrier mobility (electron mobility in N-channel transistors and hole mobility in P-channel transistors) may be increased, and thereby enhancing the drive current. Hence, increasing the stress can significantly improve the transistor's performance.

Currently, dual-stress techniques are employed to form tensile stress liners over NMOS transistors and compressive stress liners over PMOS transistors, so that the drive currents of both the PMOS transistors and the NMOS transistors may be increased, which may reduce the circuit response period.

Conventionally, when forming contact holes for a semiconductor device with dual-stress liners, the dual-stress liners need to be etched to expose silicide materials buried thereunder. Over-etch may occur in the etching process, resulting in silicide loss. This may adversely affect the device performance. Therefore, there is a need to provide a method for forming contact holds for a semiconductor device with dual-stress liners, which may suppress over-etch and thus reduce silicide loss.

SUMMARY

One embodiment of the present disclosure provides a method for forming contact holes for a semiconductor device. In the method, a substrate is provided and then a dual-stress liner is formed over the substrate. The dual-stress liner includes a first stress liner and a second stress liner having opposite stress types and partially overlapped to form an overlapping portion. The overlapping portion includes an upper stress liner formed by a portion of one of the first and second stress liners and a lower stress liner formed by a portion of an other of the first and second stress liners. A first dielectric layer can be formed over the dual-stress liner, a second dielectric layer can be formed over the first dielectric layer, and a third dielectric layer can be formed over the second dielectric layer. The second dielectric layer has a top surface leveling with a top surface of the overlapping portion. The third dielectric layer can be etched with an etching selectivity over the second dielectric layer and over the upper stress liner to form a plurality of first openings through the third dielectric layer to expose the second dielectric layer and an upper stress liner in the overlapping portion. A plurality of second openings can be formed through the second and first dielectric layers to expose each of the lower stress liner in the overlapping portion, the first stress liner, and the second stress liner such that an exposed portion of the each of the lower stress liner in the overlapping portion, the first stress liner, and the second stress liner at least have a same thickness. The exposed portion of each of the first stress liner, the second stress liner, and the lower stress liner can then be removed along the second openings to form a plurality of contact holes.

Another embodiment of the present disclosure provides a semiconductor device including a plurality of contact holes. The semiconductor device can include a substrate and a dual-stress liner disposed over the substrate. The dual-stress liner can include a first stress liner and a second stress liner having opposite stress types and partially overlapped to form an overlapping portion. The overlapping portion can include an upper stress liner formed by a portion of one of the first and second stress liners and a lower stress liner formed by a portion of an other of the first and second stress liners. A first dielectric layer can be disposed over the dual-stress liner; a second dielectric layer can be disposed over the first dielectric layer. The second dielectric layer has a top surface leveling with a top surface of the overlapping portion. A third dielectric layer can be disposed over the second dielectric layer. A plurality of second openings are disposed through the first, second, and third dielectric layers to expose each of the lower stress liner in the overlapping portion, the first stress liner, and the second stress liner such that an exposed portion of the each of the lower stress liner in the overlapping portion, the first stress liner, and the second stress liner at least has a same thickness. The plurality of contact holes can be formed by removing the exposed portion of each of the first stress liner, the second stress liner, and the lower stress liner.

Other aspects or embodiments of the present disclosure can be understood by those skilled in the art in light of the description, the claims, and the drawings of the present disclosure.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or like parts.

Figure 1:
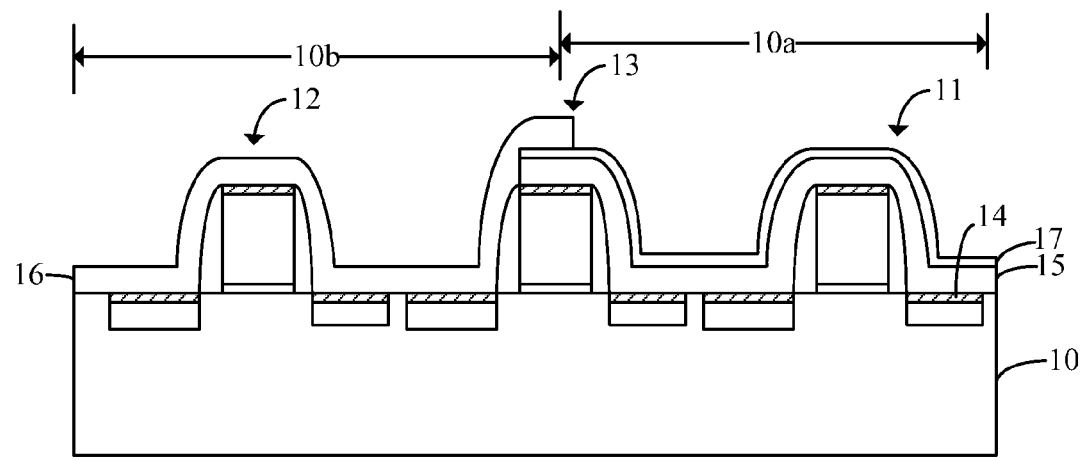
FIGS. 1 and 2 are cross-sectional views of intermediate structures illustrating a conventional method for forming contact holes in a device with a dual-stress liner.
Figure 2:
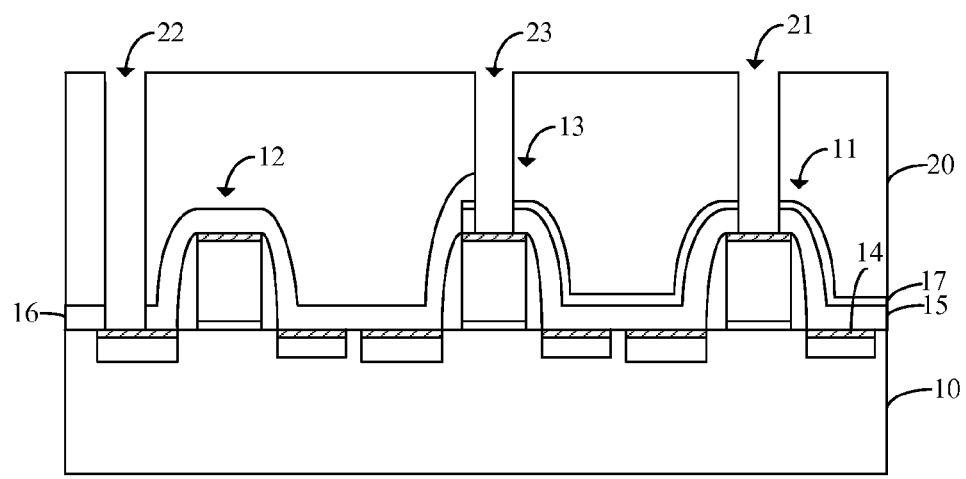

FIGS. 1 and 2 are cross-sectional views of intermediate structures illustrating a conventional method for forming contact holes in a device with a dual-stress liner.

As shown in FIG. 1, a substrate 10 is provided, which includes a first region 10a and a second region 10b. The substrate 10 is provided with multiple NMOS transistors 11 in the first region 10a (although only one of them is shown in FIG. 1), multiple PMOS transistors 12 in the second region 10b (although only one of them is shown in FIG. 1) and multiple transistors 13 at the boundary between the first region 10a and the second region 10b (although only one of them is shown in FIG. 1). For each transistor 13 at the boundary, each NMOS transistor 11, and each PMOS transistor 12, nickel silicide structures 14 are formed over the source regions, drain regions, and gates (not labeled in FIG. 1) thereof. A dual-stress liner is formed over the substrate 10, including a tensile stress liner 15 and a compressive stress liner 16. Specifically, the dual-stress liner includes: a tensile stress liner 15 over the NMOS transistor 11 and a compressive stress liner 16 over the PMOS transistor 12. At the boundary between the first region 10a and the second region 10b, the tensile stress liner 15 overlays the compressive stress liner 16, so that an overlapping portion is formed over the gate of the transistor 13. The compressive stress liner 16 and the tensile stress liner 15 are made of silicon nitride. And a silicon oxide layer 17 is formed over the tensile stress liner 15 as a hard mask.

As shown in FIG. 2, a silicon oxide layer 20 is formed over the substrate 10, overlaying the tensile stress liner 15 and the compressive stress liner 16. Then a patterned mask layer is formed, and the silicon oxide layer 20 is etched through the patterned mask layer to form contact holes 21, 22 and 23. Specifically, the contact holes 21 are formed on the gates of the PMOS transistors 11 and the gates of the NMOS transistors 12 (although only one contact hole 21 is shown in FIG. 2); the contact holes 22 are formed on the source and drain regions of the PMOS transistors 11, the NMOS transistors 22 and the transistors 13 (although only one contact hole 22 is shown in FIG. 2); and contact holes 23 are formed on the gates of the transistors 13 (although only one contact hole 23 is shown in FIG. 2).

In the conventional method, the contact holes 21, 22 and 23 are formed in the same etching process. Specifically, the contact holes 21, 22 and 23 are formed as follows: an over etching process is performed to etch through the silicon oxide layer 20, so that it can be ensured that the compressive stress liner 16, the tensile stress liner 15 and the dual-stress liner over the gate of the transistor 13 are exposed through openings formed in the over etching process; then the stress liners exposed by the openings are etched at the same time to form the contact holes, so that the nickel silicide structures 14 are exposed. Because the overlapping portion has a greater thickness, it needs more time to be etched through. Therefore, over etch may occur in the contact holes 21 and 22, causing excessive loss of nickel silicide from corresponding nickel silicide structures 14. In some cases, the nickel silicide exposed by the contact holes 21 and 22 may be totally removed. The loss of silicide may result in contact resistance increasing and device performance degrading.

The present disclosure provides a method for forming contact holes in a device with a dual-stress liner, which can suppress over-etch and reduce silicide loss.

Specific details are given below to provide a thorough understanding of the present disclosure. Those skilled in the art will understand, however, that the present disclosure may be practiced without one or more of the specific details, or with other methods. Hence, the present disclosure is not limited to the specific implementations described herein.

Figure 3:
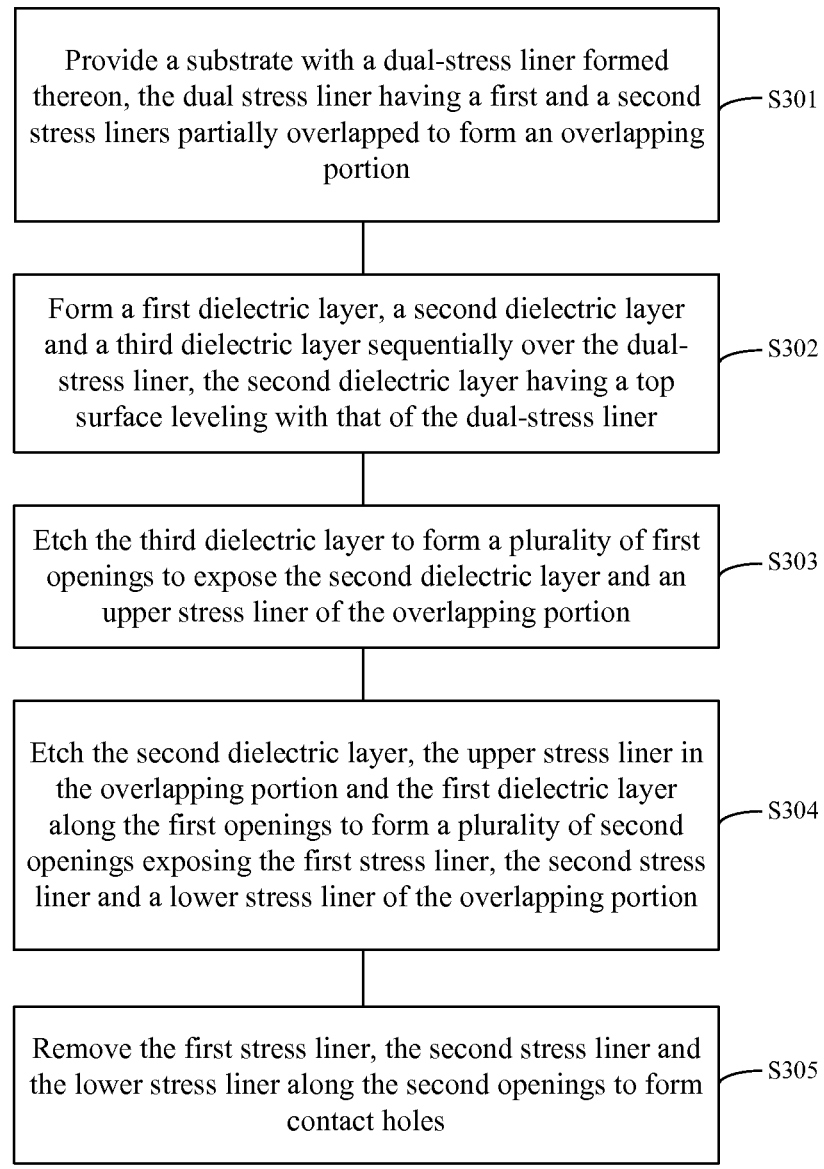
FIG. 3 is a flow chart of an exemplary method for forming contact holes according to one embodiment of the present disclosure.

FIG. 3 is a flow chart of an exemplary method for forming contact holes according to one embodiment of the present disclosure. As shown in FIG. 3, the method includes steps S31 to S35. FIGS. 4 to 13 are cross-sectional views of intermediate structures illustrating the process of forming contact holes. The method will be illustrated in conjunction with the flow chart and the cross-sectional views.

Before illustration, it is noted that the term "top surface" of a component used in the specification refers to an upper surface of the component that faces away from the substrate.

Figure 4:
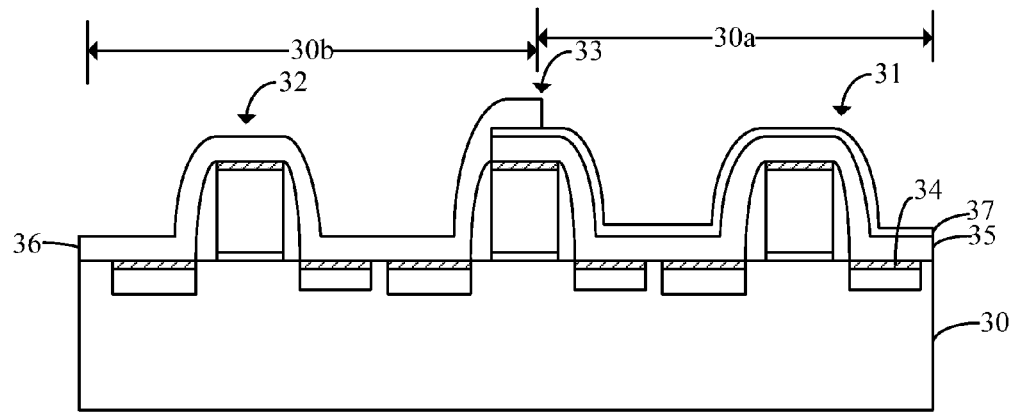
FIGS. 4 to 13 are cross-sectional views of intermediate structures illustrating an exemplary process for forming contact holes according to one embodiment of the present disclosure.

Referring to FIG. 3 and FIG. 4, by performing Step S301, a substrate 30 is provided. A dual-stress liner, including a first stress liner 35 and a second stress liner 36, is formed over the substrate 30. The first stress liner 35 and the second tress liner 36, with opposite stress types, partially overlap to form an overlapping portion. Specifically, the material of the substrate 30 may be monocrystalline silicon (Si), monocrystalline germanium (Ge) and/or GeSi. The substrate 30 may be a silicon-on-insulator (SOI) structure or germanium-on-insulator (GOI) structure. The substrate 30 may include other suitable materials, for example, Group III-V compounds such as GaAs.

Specifically, before the formation of the dual-stress liner, a first transistor 31, a second transistor 32, and a third transistor 33 are formed on the substrate 30. FIG. 4 shows only one first transistor 31, one second transistor 32, and one third transistor 33, however, the number of each of the transistors is not limited. The substrate 30 includes a first region 30a and a second region 30b. The first transistor 31 is formed in the first region 30a, the second transistor 32 is formed in the second region 30b, and the third transistor 33 is formed between the first transistor 31 and the second transistor 32, i.e., the third transistor 33 is at the boundary of the first region 30a and the second region 30b. Metal silicide structures 34 are formed over the transistors' source regions, drain regions, and gates (not labeled in FIG. 4). The first stress liner 35 overlays a source region of the third transistor 33 and the first transistor 31; the second stress liner 36 overlays a drain region of the third transistor 33 and the second transistor 32; and the second stress liner 36 overlaps the first stress liner 35 on a gate of the third transistor 33 to form an overlapping portion. The width of the overlapping portion may be less than or equal to a width of the gate of the third transistor 33. That is, the first stress liner 35 and the second stress liner 36 may both completely cover the third transistor 33's gate. Alternatively, the first stress liner 35 and/or the second stress liner 36 may cover a portion of the gate of the third transistor 33. In the example of FIG. 4, the first stress liner 35 completely covers the top surface of the gate of the third transistor 33, while the second stress liner 36 covers a portion of the first stress liner 35 over a portion of the gate of the top surface of the third transistor 33.

Although FIG. 4 shows that the overlapping portion includes the second stress liner 36 disposed over the first stress liner 35 for illustration purposes, one of ordinary skill in the art would understand that the overlapping portion can have the first stress liner 35 disposed over the second stress liner 36 without limitation. In other words, any one of the first and second stress liners can be an upper stress liner, while the other one of the first and second stress liners can be a lower stress liner. Further, a hard mask layer may be formed at least between the first and second stress liners at the overlapping portion. This hard mask layer is adapted for protecting the lower stress liner of the first and second stress liners when etching the upper stress liner of the first and second stress liners. For example, as shown in FIG. 4, a hard mask layer 37 is formed over an entire surface of the first stress liner 35 in the first region 30a. In the overlapping portion, the second stress liner 36 is formed over the hard mask layer 37, which is formed over the first stress liner 35 over the gate of the third transistor 33.

In one exemplary embodiment, the first stress liner 35 is a compressive stress liner, the second stress liner 36 is a tensile stress liner, the first transistor 31 is an NMOS transistor and the second transistor 32 is a PMOS transistor. The metal silicide is nickel silicide. However, the metal silicide is not limited to nickel silicide, it may be any other suitable metal silicide materials. In one embodiment, the tensile stress liner is formed before forming the compressive stress liner. In another embodiment, the compressive stress liner can be formed before forming the tensile stress liner.

In one embodiment, the material of the hard mask layer 37 is silicon oxide; however, it is not limited to silicon oxide, but may be any other suitable materials. The material of the first stress liner 35 is silicon nitride, and the material of the second stress liner 36 is silicon nitride; however, the materials of the first stress liner 35 and the second stress liner 36 are not limited to silicon nitride, but may be any other suitable stress liner materials. In one embodiment, the first stress liner has a thickness ranging from 50 to 1000 angstroms, the second stress liner has a thickness ranging from 50 to 1000 angstroms, and the hard mask layer 37 has a thickness ranging from 20 to 400 angstroms.

Figure 7:
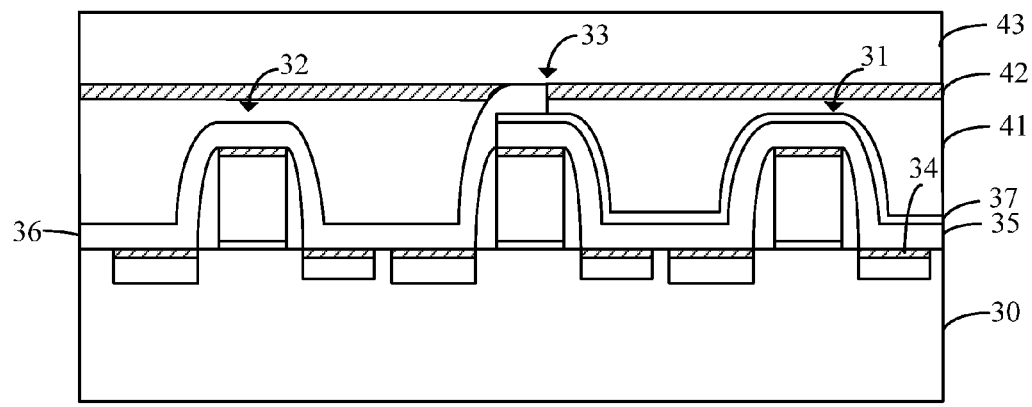

As shown in FIG. 3 and FIG. 7, by performing Step S302, a first dielectric layer 41 is formed over the dual-stress liner. A second dielectric layer 42 is formed over the first dielectric layer 41. A third dielectric layer 43 is formed over the second dielectric layer 42. The second dielectric layer 42 has a top surface leveling with the upper stress liner's top surface. It is noted that, strict flushness for the top surface of the second dielectric layer 42 is not necessarily required. Errors are permitted under certain processing conditions according to various disclosed embodiments.

Figure 5:
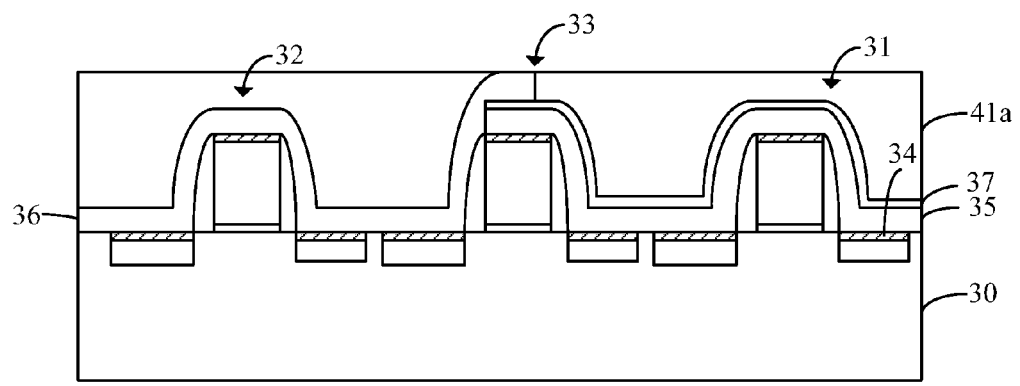

In one embodiment, Step S302 may be performed as follows. As shown in FIG. 5, a dielectric layer 41a is formed overlaying the dual-stress liner, i.e., overlaying the first stress liner 35 and the second stress liner 36. Then the dielectric layer 41a is planarized, so that the dielectric layer 41a has a top surface leveling with the top surface of the upper stress liner. In an exemplary embodiment, the material of the dielectric layer 41a is silicon oxide, and the dielectric layer 41a is formed by vapor deposition.

Figure 6:
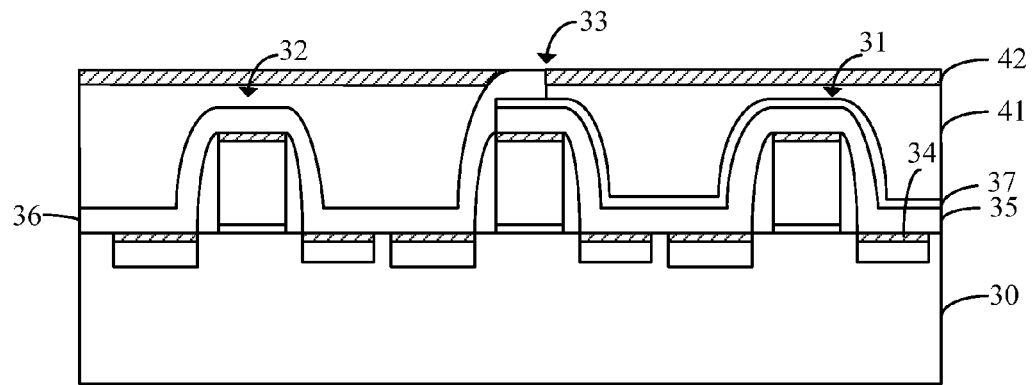

Then, as shown in FIG. 5 and FIG. 6, the planarized dielectric layer 41a is doped with ions so as to form a doped layer with a predetermined thickness. The doped layer is the second dielectric layer 42; and the undoped dielectric layer is the first dielectric layer 41. In one embodiment, the material of the dielectric layer 41a is silicon oxide and the ions are nitrogen ions, so that the second dielectric layer 42 includes nitrogen-doped silicon oxide (SiON). The second dielectric layer 42 has a thickness ranging from 50 to 500 angstroms. In the doping process, doping parameters (e.g., for doping energy and dose) can be adjusted to form the second dielectric layer 42 with a desired thickness and ion concentration. Optionally, the doping energy is selected within a range from about 3 keV to about 10 keV, and the ion dose of the nitrogen ions is selected within a range from about 3e10 to about 5e16. In the embodiment, the first dielectric layer has a thickness ranging from about 300 angstroms to about 2000 angstroms.

Then, as shown in FIG. 7, the third dielectric layer 43 is formed over the second dielectric layer 42 and the upper stress liner. In one embodiment, the material of the third dielectric layer 43 is silicon oxide; however, it is not limited to silicon oxide. The third dielectric layer 43 is formed by vapor deposition, and has a thickness ranging from about 500 angstroms to about 4000 angstroms.

Figure 9:
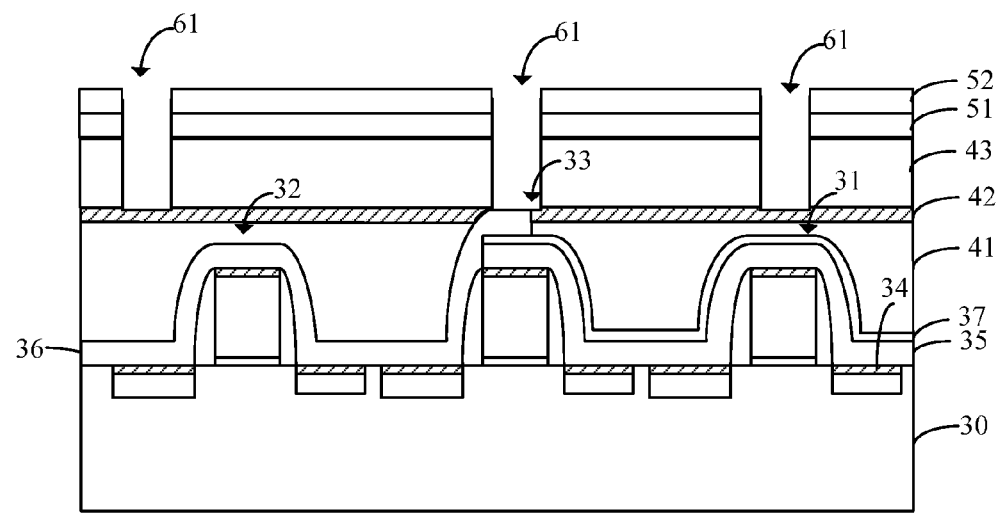

Referring to FIG. 3 and FIG. 9, by performing Step S303, the third dielectric layer 43 is etched to form a plurality of first openings 61, such that the second dielectric layer and the upper stress liner in the overlapping portion are exposed. The etching process has a high etching selectivity of the third dielectric layer 43 over the second dielectric layer 42 and over the upper stress liner in the overlapping portion, so as to ensure that the etching process stops at the second dielectric layer and the upper stress liner. The locations of the first openings 61 correspond to the locations of the contact holes to be formed on the gates, sources, and drains of the transistors. Although only three first openings 61 are shown in FIG. 9, respectively corresponding to a contact hole to be formed on the gate of the first transistor 31, a contact hole to be formed on the gate of the third transistor 33 and a contact hole to be formed on the source of the second transistor 32, one of ordinary skill in the art would understand that any number of the first openings and contact holes can be formed on corresponding transistors as desired.

Figure 8:
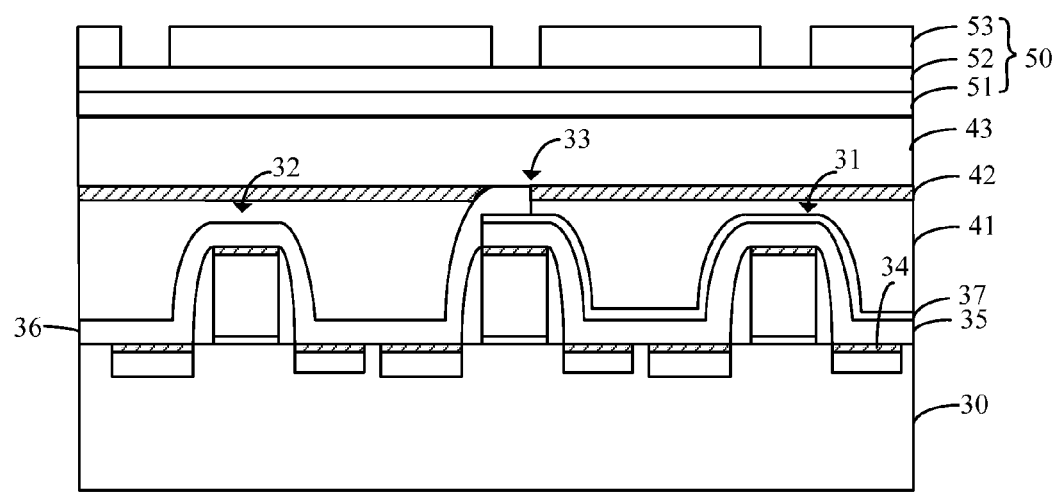

In various embodiments, Step S303 may be specifically performed as follows. Referring to FIG. 8, a mask layer 50 is formed over the third dielectric layer 43. The mask layer 50 includes: an Advanced Patterning Film (APF) 51 formed over the third dielectric layer 43, which may be formed by a chemical vapor deposition; an anti-reflective layer 52 formed over the APF 51, which may be formed by a spin coating process and then a solidifying process; and a patterned photoresist layer 53 formed over the anti-reflective layer 52, which may be formed by an exposure and development process.

Referring to FIG. 9, an etching process is performed to transfer the pattern of the patterned photoresist layer 53 (shown in FIG. 8) to the anti-reflective layer 52 and the APF 51. And then, the etching process continues to etch the third dielectric layer 43 using the patterned anti-reflective layer 52 and APF 51 as a mask, so that the first openings 61 are formed in the third dielectric layer 43. It should be noted that, during the etching process, the patterned photoresist layer 53 may be partially or completely consumed. The patterned photoresist layer is not shown in FIG. 9.

In practice, although the etching process has a high etching selectivity of the third dielectric layer 43 over the second dielectric layer 42 and over the upper stress liner, over-etch may still slightly occur. Therefore, a small amount of material loss may occur in the second dielectric layer 42 and the second stress liner 36. The etching process may be a dry etching process with a desired etching selectivity of the third dielectric layer over the second dielectric layer and over the upper stress liner ranging from about 5:1 to about 20:1, in which $C_4F_6$, $C_4F_8$, $C_5F_8$, or a combination thereof may be utilized as an etching gas.

Figure 11:
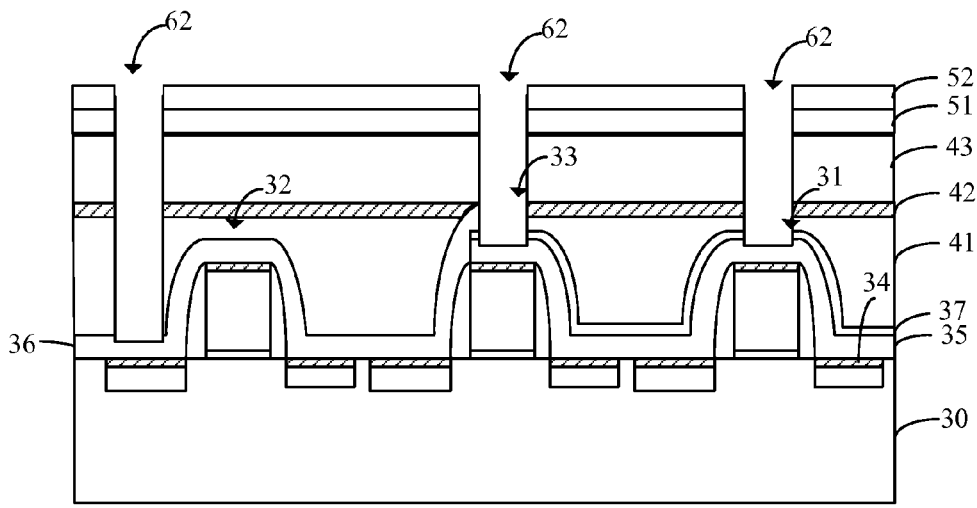

Referring to FIG. 3 and FIG. 11, by performing Step S304, the second dielectric layer 42, the upper stress liner in the overlapping portion, and the first dielectric layer 41 are etched along the first openings 61 (shown in FIG. 9), so as to form a plurality of second openings 62. The first stress liner 35, the second stress liner 36, and the lower stress liner in the overlapping portion are exposed through the second openings 62.

Figure 10:
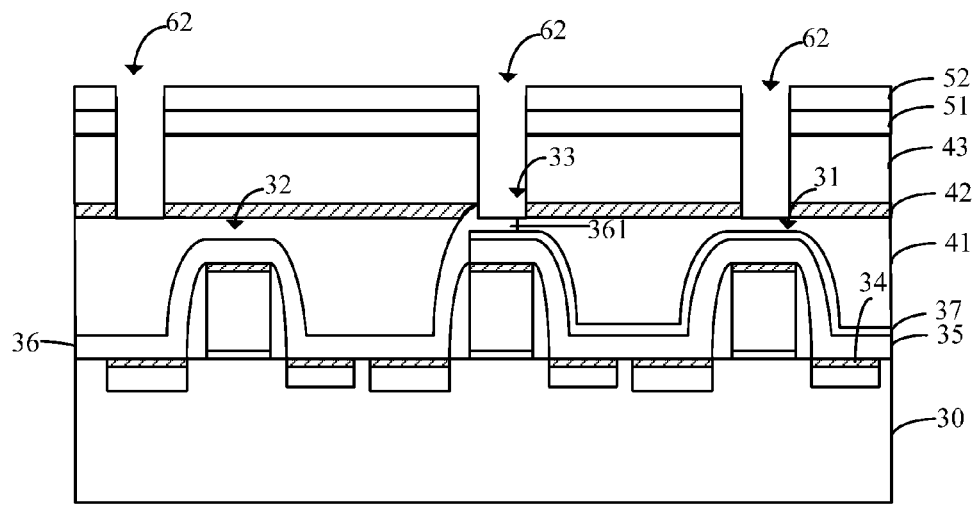

In subsequent steps, the first stress liner 35, the second stress liner 36, and the lower stress liner may be further etched to form the contact holes. As the etching through the first stress liner, the second stress liner, and the lower stress liner may be substantially the same in thickness and material, over-etch may be easily controlled and suppressed. In a specific embodiment, Step S304 is performed as follows. Referring to FIG. 10, a first etching is performed to etch the second dielectric layer 42 and the upper stress layer along the first openings 61 (shown in FIG. 9) to form the second openings 62. By the first etching, the upper stress liner is partially removed, remaining a portion 361, and the first dielectric layer 41 is exposed.

The first etching has a high etching selectivity of the second dielectric layer 42 over the first dielectric layer 41, for example, ranging from about 1:0.3 to about 1:0.8, so as to ensure that the first etching may stop at the first dielectric layer 41.

The first etching has a high etching selectivity of the upper dielectric layer to the second dielectric layer 42, for example, ranging from about 1.5:1 to about 6:1, so as to ensure that the upper stress liner may have a thickness reduction greater than that of the second dielectric layer.

In one embodiment, the first etching may be a dry etching process using $CH_3F$ and/or $CH_2F_2$ as an etching gas. Over-etch in the first etching is allowable to some extent, as long as the remaining portion 361 exists. It should be noted that, in the first etching, the anti-reflective layer 52 may be partially consumed.

Then, referring to FIG. 11, a second etching is performed to the first dielectric layer 41 and the remaining portion 361 along the second openings shown in FIG. 10, so as to form the second openings 62 shown in FIG. 11 which exposes the first stress liner 35, the second stress liner 36 and the lower stress liner. In the embodiment where the hard mask layer 37 is formed on the lower stress liner, the hard mask layer 37 is also etched through to expose the lower stress liner.

The second etching has a high etching selectivity of the first dielectric layer 41 over the dual stress liner, for example, ranging from about 5:1 to about 20:1, so as to ensure that the second etching may stop at the first stress liner 35, the second stress liner 36, and the lower stress liner in the overlapping portion.

The second etching may be a dry etching process using $C_4F_6$, $C_4F_8$, and/or $C_5F_8$ as an etching gas. It should be noted that, during the second etching, the remaining portion 361 shown in FIG. 10 is also removed to expose the lower liner. The second etching has a high etching selectivity of the first dielectric layer 41 to the dual-stress liner (the remaining portion 361 is a part of the dual-stress liner), and the first dielectric layer 41 has a thickness greater than the remaining portion 361, therefore, the remaining portion 361 and the first dielectric layer 41 may be removed at the same time by adjusting the etching selectivity.

Over-etch is allowable to some extent in both the first etching and the second etching, as long as the first stress liner, the second stress liner, and the lower stress liner exposed by the second openings have substantially the same thickness.

Figure 13:
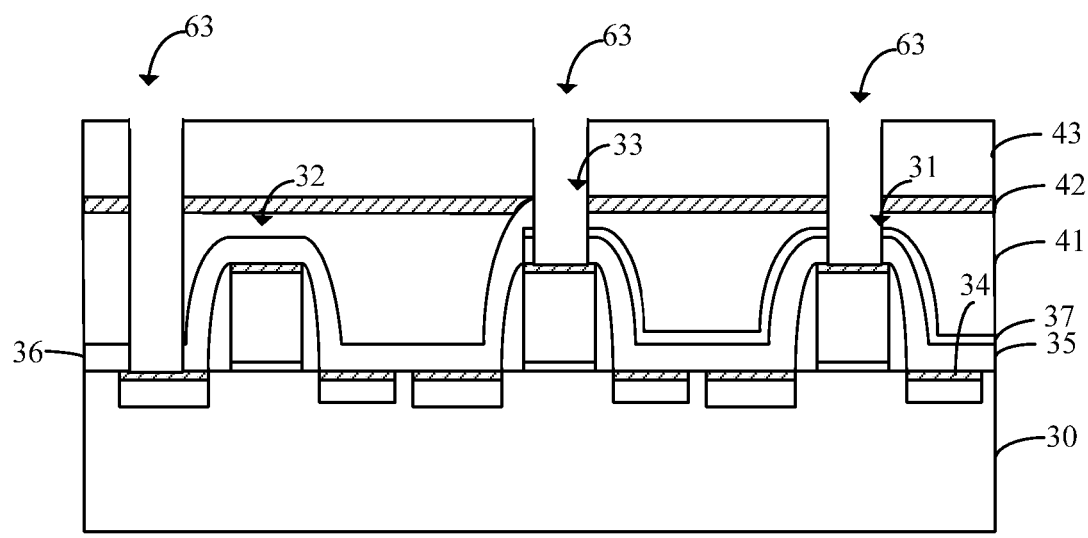

Referring to FIG. 3 and FIG. 13, by performing Step S305, the first stress liner 35, the second stress liner 36, and the lower stress liner in the overlapping portion are etched along the second openings 62, so as to form contact holes 63 exposing the metal silicide structures 34. In one embodiment, a dry etching process may be applied. The material of the stress liners is silicon nitride. The dry etching process has a high etching selectivity of silicon nitride over silicon oxide, for example, ranging from about 5 to about 20. The dry etching process may use $CH_3F$ and/or $CH_2F_2$ as the etching gas.

Figure 12:
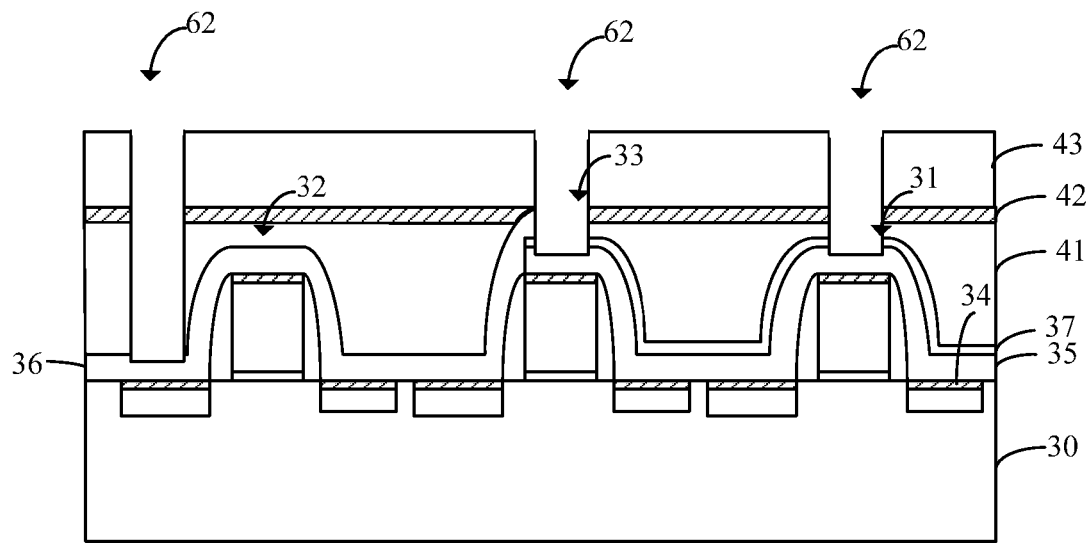

Before etching the stress liners, the remaining mask layer may be removed, as shown in FIG. 12, then, the etching is performed along the second openings 62. As the dry etching applied herein has a high etching selectivity of silicon nitride over silicon oxide, and the first dielectric layer is made of silicon oxide, the first dielectric layer can be utilized as a mask. In one embodiment, the remaining mask layer may be removed by ashing.

In modern semiconductor manufacturing, as the critical dimension continues to shrink, the photoresist layer becomes too thin to perform the function as an etching mask. The embodiment uses the APF and the photoresist layer in combination as a mask. The patterned photoresist layer defines the patterns which are transferred to the anti-reflective layer and the APF. In subsequent etching, the mask stack is consumed little by little. After the photoresist layer is consumed, the anti-reflective layer is used as the mask; and after the anti-reflective layer is consumed, the APF is used as the mask.

In the method provided by the embodiment of the present disclosure, the second dielectric layer is formed to have a top surface flush with the overlapping portion's top surface, and the etching process for forming the first openings has a high etching selectivity of the third dielectric layer over the second dielectric layer and the upper stress liner. Therefore, the etching process may stop at the second dielectric layer and the upper stress liner of the overlapping portion. In addition, in the step forming the second openings, a first etching is performed to etch the second dielectric layer and the upper stress liner, and a second etching is performed to etch the first dielectric layer and the remaining upper stress liner. The first etching has a high etching selectivity of the second dielectric layer over the first dielectric layer and a high etching selectivity of the upper stress liner over the second dielectric layer, so that the first etching may stop at the first dielectric layer, and the upper stress liner may have more thickness reduced than the second dielectric layer. The second etching has a high etching selectivity of the first dielectric layer over the dual-stress liner, so that the second etching may stop at the lower stress liner of the overlapping portion, the first stress liner and the second stress liner.

As shown in FIGS. 11-12, by controlling each etching process (e.g., the etching selectivity thereof), the exposed portion of each of the lower stress liner in the overlapping portion, the first stress liner, and the second stress liner can at least have a same thickness. When the exposed portion is etched through to expose the underlying surface (e.g., of the metal silicide structures 34) in a same etching process to form the contact holes (e.g., as shown in FIG. 13), the etch time required for the etching process and/or the degree of the etching each exposed portion can be substantially the same. Therefore, no over-etch may occur in the contact holes, which reduces silicide loss from the underlying surface.

The embodiments disclosed herein are exemplary only. Other applications, advantages, alternations, modifications, or equivalents to the disclosed embodiments are obvious to those skilled in the art and are intended to be included within the scope of the present disclosure.

What is claimed is:

1. A method for forming a semiconductor device comprising contact holes, comprising:

forming a dual-stress liner over a substrate, wherein the dual-stress liner comprises a first stress liner and a second stress liner having opposite stress types and partially overlapped to form an overlapping portion, the overlapping portion comprising an upper stress liner formed by a portion of one of the first and second stress liners and a lower stress liner formed by a portion of an other of the first and second stress liners;

forming a first dielectric layer over the dual-stress liner, a second dielectric layer over the first dielectric layer, and a third dielectric layer over the second dielectric layer, wherein the second dielectric layer has a top surface leveling with a top surface of the overlapping portion;

etching the third dielectric layer with an etching selectivity over the second dielectric layer and over the upper stress liner to form a plurality of first openings through the third dielectric layer to expose the second dielectric layer and an upper stress liner in the overlapping portion;

forming a plurality of second openings through the second and first dielectric layers to expose each of the lower stress liner in the overlapping portion, the first stress liner, and the second stress liner such that an exposed portion of the each of the lower stress liner, the first stress liner, and the second stress liner at least have a same thickness; and removing the exposed portion of each of the first stress liner, the second stress liner, and the lower stress liner along the plurality of second openings to form a plurality of contact holes.

2. The method of claim 1, wherein the plurality of second openings are formed by:

performing a first etching to the second dielectric layer and the upper stress liner along the plurality of first openings to etch through the second dielectric layer and a portion of the upper stress liner, and performing a second etching to the first dielectric layer and the remaining upper stress liner along the plurality of first openings to etch through the first dielectric layer and the remaining upper stress liner, wherein the first etching has an etching selectivity of the second dielectric layer over the first dielectric layer and an etching selectivity of the upper stress liner over the second dielectric layer, and the second etching has an etching selectivity of the first dielectric layer over the dual-stress liner.

3. The method of claim 1, wherein forming the first dielectric layer, the second dielectric layer and the third dielectric layer over the dual-stress liner comprises:

forming a dielectric layer over the dual-stress liner;

planarizing the dielectric layer until a top surface thereof levels with the top surface of the upper stress liner;

ion doping the planarized dielectric layer to form a doped layer with a predetermined thickness, the doped layer being the second dielectric layer and the undoped layer being the first dielectric layer; and forming the third dielectric layer over the second dielectric layer and the upper stress liner.

4. The method of claim 1, wherein etching the third dielectric layer has an etching selectivity of the third dielectric layer over the second dielectric layer and over the upper stress liner ranging from about 5:1 to about 20:1.

5. The method of claim 2, wherein the first etching has the etching selectivity of the second dielectric layer over the first dielectric layer ranging from about 1:0.3 to about 1:0.8, and has the etching selectivity of the upper stress liner over the second dielectric layer ranging from about 1.5:1 to about 6:1.

6. The method of claim 2, wherein the second etching has an etching selectivity of the first dielectric layer to the dual-stress liner ranging from about 5:1 to about 20:1.

7. The method of claim 1, wherein, before forming the plurality of first openings, a patterned mask layer is formed on the third dielectric layer, the patterned mask layer defines locations of the plurality of first openings, and the third dielectric layer is etched using the patterned mask layer as a mask.

8. The method of claim 7, wherein the patterned mask layer comprises an advanced pattern film on the third dielectric layer, an anti-reflective layer on the advanced pattern film, and a patterned photoresist layer.

9. The method of claim 1, wherein the exposed portion of each of the first stress liner, the second stress liner, and the lower stress liner is removed by a dry etching process.

10. The method of claim 1, wherein a material of the first dielectric layer is silicon dioxide, a material of the second dielectric layer is nitrogen-doped silicon oxide, and a material of the third dielectric layer is silicon oxide.

11. The method of claim 1, wherein the first dielectric layer has a thickness ranging from about 300 angstroms to about 2000 angstroms, the second dielectric layer has a thickness ranging from about 50 angstroms to about 500 angstroms, and the third dielectric layer has a thickness ranging from about 500 angstroms to about 4000 angstroms.

12. The method of claim 1, wherein, before forming the dual-stress liner, the method further comprises:

forming a first transistor, a second transistor, and a third transistor between the first and second transistors on the substrate, wherein the first stress liner overlays a source of the third transistor and the first transistor, the second stress liner overlays a drain of the third transistor and the second transistor, the first and second stress liners partially overlapped on a gate of the third transistor, a metal silicide structure is formed on each of a source, a drain, and a gate of each of the first, second and third transistors and gates, and the plurality of contact holes are formed to expose the metal silicide structures.

13. The method of claim 12, wherein the first stress liner is a compressive stress liner, the second stress liner is a tensile stress liner, the first transistor is a PMOS transistor and the second transistor is an NMOS transistor.

14. The method of claim 12, wherein the metal silicide comprises nickel silicide.

15. The method of claim 1, wherein a hard mask layer is formed between the first and second stress liners at least in the overlapping portion, and a material of the hard mask layer is silicon oxide.

* * * * *